United States Patent [19]

Maydan

[11] 4,298,443
[45] Nov. 3, 1981

[54] HIGH CAPACITY ETCHING APPARATUS AND METHOD

[75] Inventor: Dan Maydan, Short Hills, N.J.

[73] Assignee: Bell Telephone Laboratories, Incorporated, Murray Hill, N.J.

[21] Appl. No.: 105,620

[22] Filed: Dec. 20, 1979

Related U.S. Application Data

[63] Continuation-in-part of Ser. No. 65,138, Aug. 9, 1979, abandoned.

[51] Int. Cl.³ .............................................. C23C 15/00
[52] U.S. Cl. ................................ 204/192 E; 156/345; 156/643; 204/298
[58] Field of Search ................ 204/192 E, 298; 118/500, 503; 156/345, 643

[56] References Cited

U.S. PATENT DOCUMENTS

| | | | |
|---|---|---|---|
| 3,598,710 | 8/1971 | Davidse | 204/192 |
| 3,844,924 | 10/1974 | Cunningham et al. | 204/298 |
| 3,879,597 | 4/1975 | Bersin et al. | 219/121 P |
| 3,901,784 | 8/1975 | Quinn et al. | 204/192 |
| 3,932,232 | 1/1976 | Labuda et al. | 204/192 |
| 4,126,530 | 11/1978 | Thornton | 204/192 EC |

FOREIGN PATENT DOCUMENTS 2308200  12/1976  France ........................... 204/298

Primary Examiner—Aaron Weisstuch
Attorney, Agent, or Firm—Lucian C. Canepa

[57] ABSTRACT

An apparatus for high-throughput sputter etching or reactive sputter etching of wafers comprises a multi-faceted wafer holder centrally disposed within a cylindrical chamber. A source of r-f power is capacitively coupled to the holder and the cylindrical chamber is grounded. By establishing a suitable plasma within the chamber, simultaneous anisotropic etching of, for example, twenty-four 6-inch wafers can be achieved in an apparatus that is approximately the same size as a conventional parallel-plate reactor that has a capacity of only three 6-inch wafers.

15 Claims, 8 Drawing Figures

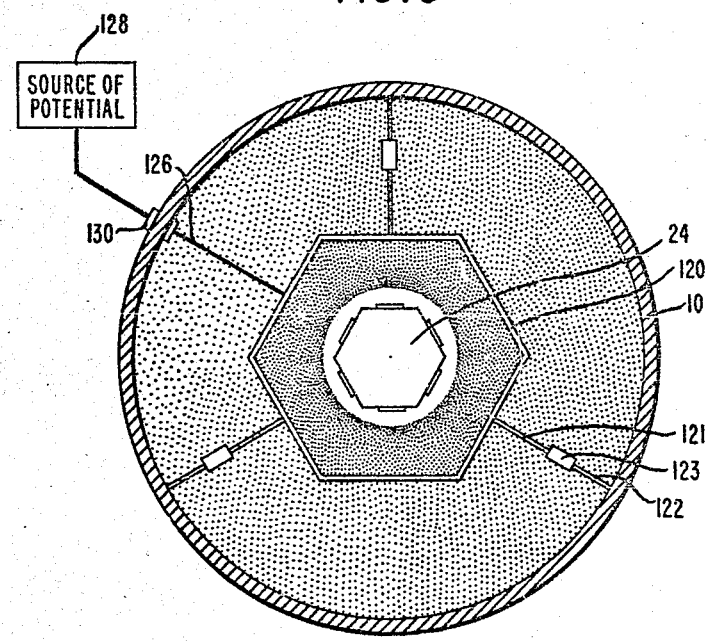

HIGH CAPACITY ETCHING APPARATUS AND METHOD

CROSS-REFERENCE TO RELATED APPLICATION

This is a continuation-in-part application of a commonly assigned copending application designated Ser. No. 65,138, filed Aug. 9, 1979, now abandoned.

BACKGROUND OF THE INVENTION

This invention relates to high-precision patterning and, more particularly, to an apparatus in which fine-line patterns are delineated by dry etching processes.

Considerable interest exists in employing dry processing techniques for patterning workpieces such as semiconductor wafers. The interest in dry processing techniques stems from their generally better resolution and improved dimensional and shape control capabilities relative to standard wet etching. Thus, dry etching is being utilized increasingly for, for example, pattern delineation in the processing of semiconductor wafers to form large-scale-integrated (LSI) devices.

Various dry etching processes that involve radio-frequency-generated plasmas are known. These processes include sputter etching which is described, for example, in *J. Vac. Sci. Technol.*, Vol. 13, No. 5, pp. 1008–1022, Sept./Oct. 1976, and reactive sputter etching which is described, for example, in *Proc.* 6th Int'l. Vacuum Congr. 1974, *Japan. J. Appl. Phys.*, suppl. 2, pt. 1, pp. 435–438, 1974.

Heretofore, so-called parallel-plate reactors have been utilized for sputter etching or reactive sputter etching of workpieces such as semiconductor wafers. In many cases of practical importance, however, it has been recognized that the throughput characteristics of available reactors have not been adequate for large-scale production of LSI devices. Accordingly, efforts have been directed at trying to devise high-throughput etching equipment that would be capable of simultaneously processing a relatively large number of workpieces. It was recognized that such equipment, if available, could substantially decrease the cost of devices processed therein.

SUMMARY OF THE INVENTION

Hence, an object of the present invention is an improved etching apparatus. More specifically, an object of this invention is an etching apparatus exhibiting a high-throughput characteristic.

Briefly, these and other objects of the present invention are realized in a specific illustrative embodiment thereof that comprises a multi-faceted workpiece holder centrally disposed within a cylindrical chamber. A source of radio-frequency (r-f) power is capacitively coupled to the holder and the cylindrical chamber is grounded. A gaseous atmosphere is established within the chamber. In response to r-f excitation of the apparatus, a dark space is formed in the immediate vicinity of the holder and a plasma is formed between the dark space and the inner wall of the chamber. In such an embodiment, uniform high-throughput sputter etching or reactive sputter etching of workpieces such as semiconductor wafers can be carried out in a reliable and low-cost way.

In accordance with a feature of the present invention, workpieces whose top surfaces are to be etched are respectively mounted on conductive portions of the workpiece holder. The workpieces are secured in place on the holder to establish electrical contact between the conductive portions and the bottom surfaces of the workpieces. The instrumentality utilized to secure the workpieces in place exposes the workpiece surfaces to be etched to the gaseous atmosphere. All other surfaces exposed to the etching atmosphere in the vicinity of the workpieces are designed to be nonconductive.

In accordance with a further feature of this invention, an embodiment of the type described above adapted to carry out reactive sputter etching includes a grid element interposed between the workpieces and the inner surface of the cylindrical chamber. In such an embodiment, the difference in etching rates between those portions of the workpiece surfaces designed to be etched and those portions thereof designed not to be etched can be significantly increased.

BRIEF DESCRIPTION OF THE DRAWING

A complete understanding of the present invention and of the above and other features thereof may be gained from a consideration of the following detailed description presented hereinbelow in connection with the accompanying drawing, in which:

and FIG. 8 is a schematic top view of the apparatus of FIG. 7.

DETAILED DESCRIPTION

Figure 1:
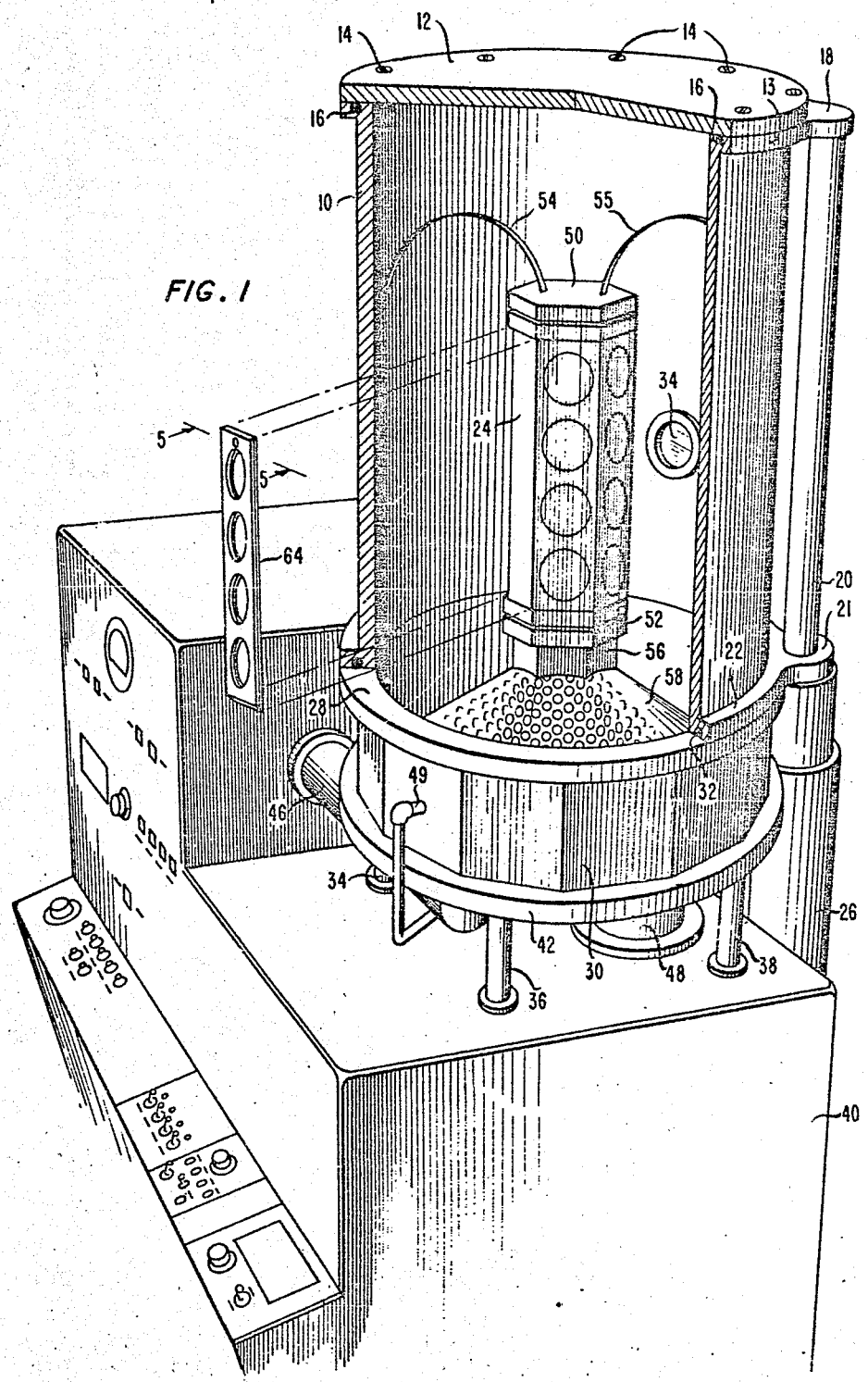
FIG. 1 is a partially broken away depiction of a specific illustrative etching apparatus made in accordance with the principles of the present invention.

The specific illustrative system depicted in FIG. 1 comprises a main cylindrical etching chamber 10 made of an electrically conductive material such as, for example, aluminum or stainless steel. By any standard affixing means such as screws 14, a member 12 is secured to an upper flange portion 13 of the cylindrical chamber 10. In addition, the member 12 is sealed to the top of the chamber 10 by a conventional O-ring 16.

Illustratively, the flange portion 13 of the chamber 10 of FIG. 1 includes an extension 18 that is mechanically attached to a supporting arm 20. In turn, the bottom end of the arm 20 is attached to an extension 21 of a lower flange portion 22 of the chamber 10. By means of the arm 20, the chamber 10 can be raised upwards to provide access by an operator to a workpiece holder 24 that is centrally mounted within the depicted apparatus. In one particular illustrative example, the arm 20 is a component part of a standard hydraulic lifting mechanism 26.

When the chamber 10 of FIG. 1 is raised fully upward by means of the arm 20, the holder 24 is rendered accessible for mounting workpieces thereon. The particular illustrative holder 24 shown in FIG. 1 includes six flat surfaces or facets. By way of a specific example, each such surface indicated in FIG. 1 is designed to have four 6-inch wafers mounted thereon. One illustrative way in which the wafers are so mounted on the holder 24 will be specified in detail later below.

When the chamber 10 is lowered into the position shown in FIG. 1, the lower flange portion 22 rests on the upper rim 28 of a metallic base member 30. A seal is achieved between the chamber 10 and the base member 30 by interposing a conventional O-ring 32 therebetween. With the apparatus of FIG. 1 in its depicted position, observation of the sealed interior of the chamber 10 can be made via a viewing port 34.

A bottom plate 42 of the base member 30 of FIG. 1 is mechanically supported by columns 34, 36, 38 . . . on one of the top surfaces of auxiliary equipment 40. Two conduits 46 and 48 extend from the equipment 40 through respective openings in the bottom plate 42. As will be evident later below in connection with the description of FIG. 2, the conduit 46 contains therein two fluid-carrying pipes and a conductive bus. The fluid carried in the pipes is utilized to cool the workpiece holder 24, and the bus is for the purpose of capacitively coupling a high-frequency potential to the holder 24. The conduit 48, which is connected to a standard vacuum pump in the equipment 40, serves to establish a prescribed low-pressure condition in the sealed chamber 10. In addition, an inlet pipe 49 is utilized to introduce a specified gas or mixture of gases into the depicted chamber from the equipment 40.

The schematically depicted equipment 40 represented in FIG. 1 is conventional in nature. It includes, for example, a vacuum system, gas sources, a variable high-frequency alternating-current (a-c) power supply adjustable to operate in, for example, the range 8 kilohertz to 50 megahertz, a pumped source of cooling fluid, and associated standard controls and gauges by means of which specified operating conditions of the type set forth later below are established in the chamber 10. (Herein, for purposes of a specific illustrative example, r-f excitation of the etching apparatus at a frequency of 13.5 megahertz will be assumed.)

In accordance with the principles of the present invention, the aforementioned bus is connected to the workpiece holder 24 (FIG. 1) and the chamber 10 is connected to a fixed point of reference potential such as electrical ground. Moreover, the a-c driven holder 24 is electrically insulated from both a top conductive element 50 and a bottom conductive element 52. In turn, the top element 50 is electrically connected to the inner surface of the chamber 10 via conductive strips 54, 55. The bottom element 52 contacts a conductive collar 56 and an apertured conductive member 58. In turn, the bottom edge of the member 58 electrically contacts the base member 30. Thus, the elements 50 and 52, the collar 56 and the member 58 are in effect all electrically connected to the same point of reference potential as is the chamber 10.

In FIG. 1, the workpiece holder 24 constitutes the cathode and the chamber 10 constitutes the anode of the depicted apparatus. In accordance with the invention, the anode-to-cathode area ratio ($A_a:A_k$) is designed to exceed unity. Illustratively, this ratio is selected to be in the range 1.5 to 10. In one specific advantageous system of the type represented in FIG. 1, this ratio was designed to be approximately 2.6. More generally, $A_a:A_k = D_a:D_k$, where $D_a$ is the diameter of the chamber 10 and $D_k$ is the diameter of the holder 24.

The area of the cathode of the apparatus depicted in FIG. 1 is approximately the sum of the surface areas of the six facets of the workpiece holder 24. The area of the anode thereof is approximately the area of the cylindrical band of the inner surface of the chamber 10 that is directly opposite and equal in height to the facets of the holder 24.

Cooling of the holder 24 of the FIG. 1 apparatus is advantageous. Otherwise, heat generated during the etching process may cause material included on the workpiece to flow and thereby deleteriously alter the geometry of the device being fabricated. Moreover, by controlling the temperature of the holder 24 to maintain a specified optimal temperature on the surfaces thereof, a relatively uniform and efficient etching action is achieved for materials whose etch rates are temperature dependent.

In an apparatus made in accordance with the principles of the present invention, a plasma of the type typically utilized in conventional sputter etching or reactive sputter etching is established in the sealed chamber 10 (FIG. 1). In particular, a symmetrical dark space is formed in the immediate vicinity of the workpiece holder 24 and a plasma is formed between the dark space and the inner wall of the chamber 10.

Figure 2:
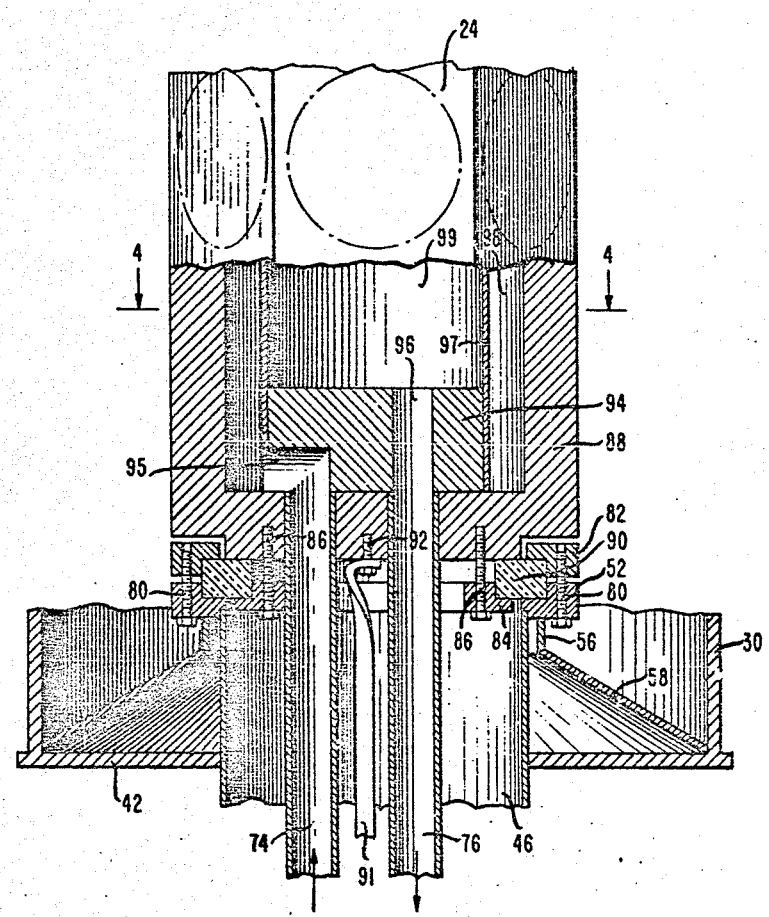
FIGS. 2 and 3 show respective portions of a center member included in the FIG. 1 apparatus.
Figure 3:
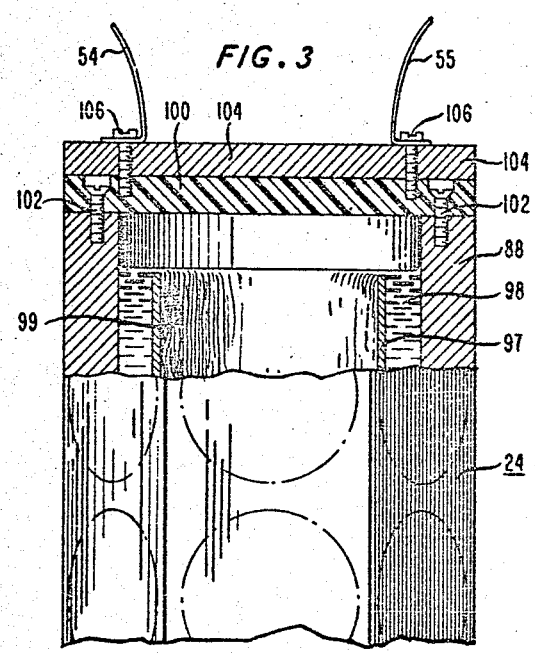
Figure 4:
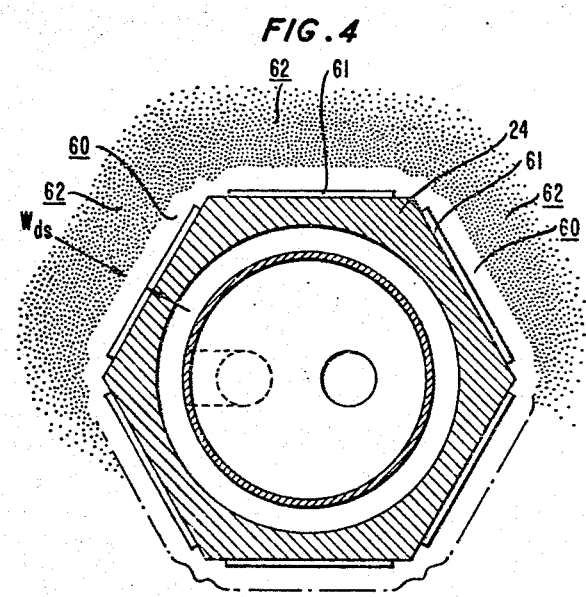
FIG. 4 is a top view of the center member.

In FIG. 4, which is a top sectional view of the workpiece holder 24 shown in FIG. 1 through 3, a dark space 60 is schematically represented as enveloping workpieces 61 mounted on the facets of the hexagonal holder 24. In turn, a radio-frequency-generated plasma 62 is depicted as enveloping the dark space 60. As specified before, this plasma fills the entire space between the dark space and the inner surface of the chamber 10. Additionally, since the elements 50, 52, the collar 56 and the member 58 (see FIG. 1) are electrically connected to the chamber 10, the aforementioned plasma extends to the surfaces of these components also. Hence, the dark space, which in effect defines the regions where etching can occur, is confined in the depicted apparatus to the immediate vicinity of the facets of the holder 24.

Wafer-containing assemblies for each mounting four wafers to be etched on the respective facets of the holder 24 are shown in FIG. 1 (see, for example, assembly 64). The details of a portion of the assembly are illustrated in a sectional view in FIG. 5.

Figure 5:
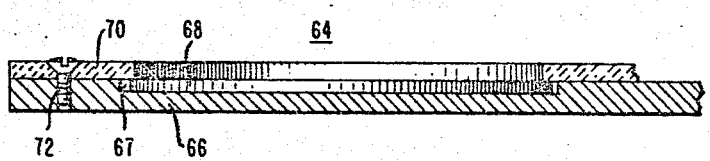
FIG. 5 illustrates the manner in which workpieces are secured in place in the depicted apparatus.

The assembly 64 shown in FIG. 5 comprises a conductive base plate 66 made, for example, of aluminum. Four wafer-holding recesses are formed in the plate 66. Illustratively, these recesses are cylindrical and just slightly larger in diameter than the respective wafers designed to be placed therein. The depth of the recesses is approximately the same as the thickness of the wafers. One such recess 67, having a wafer 68 therein, is indicated in FIG. 5. A nonconductive top plate 70 made, for example, of fused silica (or of aluminum oxide, or of silicon, or comprising a dielectric material deposited on a metallic plate) is secured to the base plate 66 by screws (one of which, designated 72, is shown in FIG. 5). The top plate 70 contains four apertures therethrough in aligned registry with the recesses in the plate 66. The diameter of each aperture is slightly less than the diameter of the wafer contained in the recess immediately thereunder. Accordingly, the plate 70 serves to retain the workpieces to be etched in place in the base plate 66. A major portion of the top surface of each retained workpiece is thereby exposed through the respective aperture in the plate 70. When the wafer-containing assemblies are screwed in place on the facets of the holder 24, the top or exposed surfaces of the retained workpieces are mounted in place for etching in the apparatus shown in FIG. 1. When so mounted, the bottom surfaces of the workpieces are maintained in electrical contact with the base plate 66 which, in turn, is in electrical contact with the holder 24. Maintaining good electrical contact between the workpieces and the cathode holder in this manner has been determined to be particularly important when carrying out, for example, anisotropic etching of doped polysilicon.

Before describing typical operating conditions for the FIG. 1 apparatus, further details of the holder 24 will be described with the aid of FIGS. 2 and 3.

In FIG. 2, the previously specified conduit 46 is shown extending through the bottom plate 42 of the base member 30. Contained within the conduit 46 are two nonconductive pipes, an inlet pipe 74 and an outlet pipe 76, for carrying cooling fluid to and from the workpiece holder 24.

The conduit 46 (FIG. 2), which is made, for example, of stainless steel, constitutes the main structural support for the holder 24. The upper end of the conduit 46 is attached by any standard means to the conductive element 52. In turn, the element 52 is secured by screws 80 to ring member 82. Another ring member 84 is fastened by screws 86 into the bottom of a metallic block 88 that constitutes a major component of the holder 24. A nonconductive ring element 90 made, for example, of glass is clamped between element 52 and member 82 and between member 84 and block 88. It is evident, therefore, that the block 88 is electrically insulated from the depicted mechanical supporting structure therefor.

An r-f bus 91 is also contained within the conduit 46 shown in FIG. 2. Illustratively, the top end of the bus 91 is electrically connected to the conductive block 88 by a screw 92. In that way, the holder 24 can be electrically driven by the aforementioned a-c power source contained in the equipment 40 of FIG. 1 to establish a plasma in the herein-considered etching apparatus.

The block 88 of FIG. 2 has a centrally located cylindrical bore formed therein. As indicated in FIGS. 2 and 3, the bore extends through the top of the block 88 but ends short of the bottom of the block 88. Positioned at the bottom of the bore is a cylindrical member 94 which is made, for example, of aluminum. Openings 95 and 96 respectively aligned with the fluid-carrying pipes 74 and 76 are formed in the member 94. Further, a cylindrical sleeve 97 is centrally positioned within the specified bore in the block 88 in snug engagement with the member 94. An opening is formed at the bottom of the sleeve 97 in alignment with the opening 95 in the member 94.

As shown in FIG. 2, the diameter of the sleeve 97 is less than that of the depicted bore in the block 88. As a result, passageways 98 and 99 are defined within the holder 24. Cooling fluid directed through the inlet pipe 74 flows upwards through the annular passageway 98 to the top of the bore (see FIG. 3) and returns via the cylindrical passageway 99 to the outlet pipe 76 shown in FIG. 2.

FIG. 3 indicates the manner in which the top of the holder 24 is constructed. An electrically insulating plate 100 is attached to the block 88 with screws 102. In turn, an electrically conductive plate 104 is secured to the plate 100 with screws 106. In addition, portions of the aforedescribed conductive strips 54 and 55 are shown connected to the plate 104 by means of the screws 106.

The specific illustrative apparatus described herein is adapted to simultaneously etch twenty-four workpieces. A number of particular examples of sputter etching or reactive sputter etching in the depicted apparatus are set forth below.

Various gases are suitable for introduction into the apparatus of FIG. 1 to carry out sputter etching therein. Thus, for example, substantially pure gases such as argon, helium, neon, nitrogen, xenon, krypton or mixtures thereof, or other gaseous atmospheres known in the art to be suitable for sputter etching, can be utilized for sputter etching in the depicted apparatus. In one particular illustrative example, a gold layer on each of multiple wafers was selectively sputter etched within the chamber 10 using a titanium or tantalum masking layer in an atmosphere comprising 80 percent argon and 20 percent dry air by volume. In this example, the holder 24 was driven by an r-f source operating at 13.5 megahertz to provide power at a density of approximately 0.3 watts per square centimeter at the surface of the layers to be etched. Etching of the gold layers occured at a rate of about 500 Angstrom units per minute when the gas flow into the apparatus was approximately 5-to-20 cubic centimeters per minute was approximately 5-to-20 cubic centimeters per minute and the pressure within the etching apparatus was established in the range 5-to-10 microns.

In an atmosphere of substantially pure argon and under operating conditions that were otherwise the same as those specified above for gold, multiple layers of permalloy were simultaneously sputter etched in the FIG. 1 apparatus at a rate of approximately 300 Angstrom units per minute.

Reactive sputter etching can be carried out in the FIG. 1 apparatus utilizing a variety of gases. Gases such as, for example, substantially pure oxygen, chlorine, $C_2F_6$, $CHF_3$, $ClF_3$, $BCl_3$, $SiF_4$, any one of the freon gases, or mixtures thereof, or mixtures of the aforespecified gases with helium, argon, nitrogen, hydrogen, xenon, neon or krypton, or other gaseous atmospheres known in the art to be suitable for reactive sputter etching, can be utilizing for reactive sputter etching in the depicted apparatus. In one particular illustrative example, a thermally grown silicon dioxide layer on each of multiple wafers was selectively etched within the chamber 10 using a photoresist masking layer in an atmosphere comprising substantially pure $CHF_3$. In this example, the holder 24 was driven by an r-f source operating at 13.5 megahertz to provide power at a density of approximately 0.5 watts per square centimeter at the surface of the layers to be etched. Etching of the oxide layers occurred at a rate of about 500 Angstrom units per minute when the gas flow into the apparatus was approximately 5-to-50 cubic centimeters per minute and the pressure within the etching apparatus was established at about 5 microns.

Figure 6:
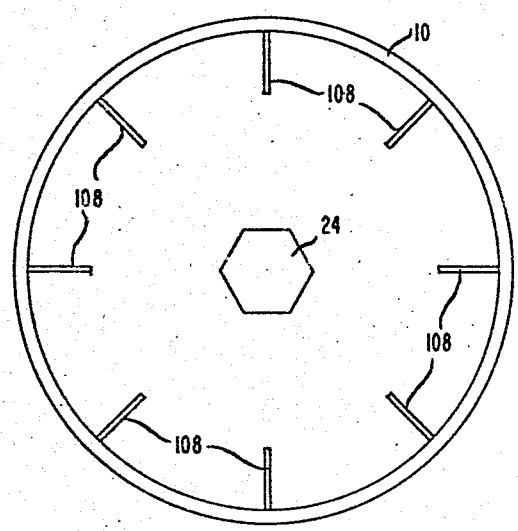
FIG. 6 is a schematic top view of a portion of another specific illustrative etching apparatus made in accordance with the principles of this invention.

Finally, it is to be understood that the above-described arrangements are only illustrative of the principles of the present invention. In accordance with these principles, numerous modifications and alternatives may be devised by those skilled in the art without departing from the spirit and scope of the invention. For example, it is advantageous in some cases of practical importance to modify the inner surface of the chamber 10 of FIG. 1 to include thereon an instrumentality for capturing material sputtered from the holder 24. A honeycomb structure or simply an array of vertically extending vanes 108 (FIG. 6) affixed to the inner surface of the chamber 10 is effective for this purpose. Such a modified structure is also characterized by an especially uniform dark field around the holder 24, whereby highly uniform etching of the multiple workpieces mounted on the holder 24 is achieved. Moreover, because in a structure of the type shown in FIG. 6 the effective anode area is substantially increased, the surface area of the cathode or holder 24 may be correspondingly increased while still maintaining an optimal anode-to-cathode area ratio. Accordingly, the wafer-holding capacity of such a modified structure can be designed to be particularly high.

An alternative etching apparatus exhibiting a high-throughput characteristic is disclosed in a commonly assigned application of M. P. Lepselter, application Ser. No. 65,185, which was filed concurrently with the parent (the aforecited application Ser. No. 65,138) of this application.

Figure 7:
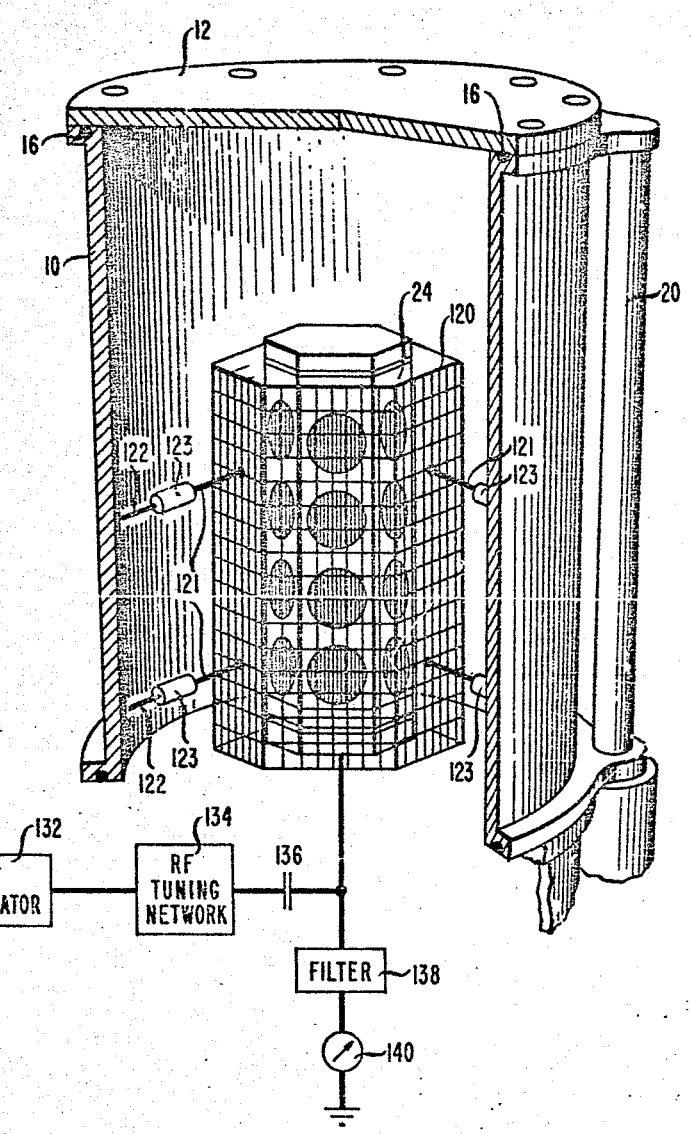
FIG. 7 is a depiction similar to FIG. 1 but showing, additionally, a grid element included in a reactive sputter etching apparatus made in accordance with this invention.

Another advantageous embodiment of the principles of the present invention is shown in FIG. 7 which represents a modification of the FIG. 1 apparatus. Identical elements in the two figures are designated with the same reference numerals. As will be specified hereinbelow, the FIG. 7 equipment constitutes an advantageous reactive sputter etching apparatus.

In FIG. 7, a grid element 120 is shown mounted in the chamber 10 surrounding the workpiece holder 24. Illustratively, the element 120 is mounted therein by means of plural identical assemblies each of which comprises rigid metallic rod members 121, 122 having an insulating spacer 123 therebetween. In that way, the grid element 120 is, illustratively, maintained in a so-called electrically floating condition with respect to both the anode 10 and the cathode 24 of the depicted apparatus.

By way of a specific illustrative example, the particular grid element 120 shown in FIG. 7 is represented as having six sides each of which is spaced apart from and parallel to a corresponding facet of the hexagonal workpiece holder 24. Other geometries for the element 120 are also feasible. Thus, for example, the element 120 may, alternatively, comprise a conductive cylinder spaced apart from the holder 24 and centrally mounted within the chamber 10.

For the particular hexagonal grid element shown in FIG. 7, six of the aforedescribed mounting assemblies are utilized to hold the grid element 120 in place. Two of these assemblies, which extend between the back side of the element 120 and the inner wall of the chamber 10, are not shown in FIG. 7. The rod members 121 and 122 of the depicted assemblies are spot welded, or otherwise suitably attached in a secure mechanical fashion, to the element 120 and the chamber 10. Accordingly, when the chamber 10 is fully raised upward by means of the arm 20, as described earlier hereinabove, the grid element is also moved upward. In that way, the holder 24 is rendered accessible for mounting workpieces thereon.

The schematically represented grid element 120 of FIG. 7 comprises, illustratively, a lattice of orthogonally disposed overlapping conductive members made, for example, of aluminum or stainless steel strips or wires or rods. But other alternative constructions for the element 120 are also suitable for inclusion in a reactive sputter etching apparatus made in accordance with the principles of the present invention. For example, the element 120 may be formed simply by making apertures in a hexagonal metallic member or in a sheet of metal formed in the shape of a cylinder.

In one particular illustrative embodiment of the FIG. 7 apparatus, the grid element 120 was formed such that the openings therein constituted approximately 50 percent of the total surface area thereof. But other embodiments in which the opening percentage ranges from approximately zero to 90 are also feasible.

In one specific embodiment of applicant's etching apparatus, the distance between each face of the centrally positioned workpiece holder 24 (FIG. 7) and the inner surface of the chamber 10 was approximately 5 inches. In that specific embodiment, the grid element 120 was centrally positioned in the depicted apparatus such that each of its faces was about 3 inches from the inner surface of the chamber 10. But various other spacings are suitable. In general, the spacing between the holder 24 and the grid element 120 should be at least twice the width $w_{ds}$ (see FIG. 4) of the aforespecified dark space established in the chamber during etching.

As shown in FIG. 7, an r-f generator 132 and an r-f tuning network 134 are electrically connected via a capacitor 136 to the workpiece holder 24. By means of a filter 138 and a meter 140, an indication is provided of the peak r-f voltage applied to the holder 24. In one specific illustrative case in which reactive sputter etching was carried out, the potential indicated on the meter 140 was −300 volts.

FIG. 8 is a schematic top view of a portion of the FIG. 7 apparatus. As discussed above, the grid element 120 is advantageously mounted in the depicted apparatus in an electrically isolated way to constitute a so-called floating grid. Alternatively, however, it is feasible to carry out reactive sputter etching in such a grid-equipped apparatus by electrically connected the element 120 directly to an external source of potential 128. Thus, for example, lead 126 shown in FIG. 8 may be utilized to connect the element 120 to the source 128. Illustratively, the lead 126 extends through the chamber 10 via a standard insulating seal 130.

In accordance with a feature of the present invention, the voltage applied to the grid element 120 by the source 128 of FIG. 8 is selected to fall in a specified range. In particular, the range extends, for example, from slightly above ground to a value that is the negative of the peak r-f voltage measured by the meter 140 (FIG. 7).

FIG. 8 schematically depicts the plasma established in the chamber 10 during reactive sputter etching, whether the aforespecified grid is floating or connected to an external source. In the region between the workpiece holder 24 and the grid element 120, a so-called bright plasma is formed, whereas in the space between the element 120 and the chamber 10 a so-called diffuse plasma is established. Illustratively, the density of ions in the holder-to-grid region is at least three times that in the grid-to-chamber space.

A grid-equipped reactive sputter etching apparatus made in accordance with the principles of the present invention exhibits advantageous characteristics. In particular, the difference in etching rate between various materials is increased therein relative to the difference exhibited in such an apparatus that does not include a grid element.

In one specific example of practical importance, a resist-masked layer of polysilicon overlying a layer of silicon dioxide was selectively etched in a grid-equipped reactive sputtering apparatus of the type shown in FIGS. 7 and 8. In a $CF_4$ atmosphere, at an r-f power input setting of 150 watts, with the gas flow into the chamber set at approximately 20 cubic centimeters per minute and the pressure within the chamber established at about 6 microns, the polysilicon layer was etched at a rate of approximately 500 Angstrom units per minute. In that illustrative case, any exposed silicon dioxide was etched at a rate of about 25 Angstrom units per minute. By contrast, under the same conditions, but without a grid in the apparatus, the polysilicon layer is etched at approximately the same rate but, significantly, the silicon dioxide layer is etched at the considerably higher rate of approximately 80 Angstrom units per minute. Moreover, in the grid-equipped apparatus, the masking resist layer is eroded to a lesser extent during etching than is the case when reactive sputter etching is carried out in an apparatus without a grid.

Similarly, the relative reactive sputter etching rates of other materials are enhanced by utilizing an apparatus of the type shown in FIGS. 7 and 8. For example, by employing a standard $CHF_3$ atmosphere in such an apparatus, the etch rate of a resist-masked silicon dioxide layer relative to the etch of an underlying polysilicon layer can be thereby significantly increased. In that case, erosion of the masking resist layer is also reduced relative to the erosion thereof that occurs in a gridless apparatus under similar operating conditions.

A complete and definitive theory of operation for the reactive sputter etching process that occurs in a grid-equipped apparatus of the type shown in FIGS. 7 and 8 has not been formulated. But a tentative simplified explanation for the improved results specified above has been established. Although the validity and scope of applicant's invention clearly do not depend to any extent on the accuracy or comprehensiveness of that explanation, it is instructive nevertheless to set it forth briefly herein.

It is speculated that all etching reactions that are primarily physically assisted chemical reactions remain essentially the same for a given set of operating parameters (e.g., power input, type of gas, gas flow, pressure) whether the reactive sputter etching apparatus includes a grid or not. This is confirmed in practice by the fact that the etching rates of the polysilicon layer in the first example set forth above remain essentially the same in the two types of equipment. In those examples, polysilicon is removed during etching primarily due to physically assisted chemical processes. But, in a grid-equipped apparatus, the energy of ions incident on the workpiece surfaces is relatively decreased due to the presence of the grid. In turn, this causes a decrease in the rate of removal of materials which are eroded primarily by a physical etching action. This is confirmed in practice by the observation that the rate of removal of the underlying silicon dioxide layer in the first example set forth above is substantially reduced in a grid-equipped apparatus.

I claim:

1. In combination in an etching apparatus,
   a conductive cylindrical chamber adapted to be connected to a point of reference potential,
   a single multi-faceted cathode wafer holder centrally positioned within said chamber,
   means for capacitively coupling said cathode wafer holder to a source of a-c power,
   and means for establishing a gaseous atmosphere within said chamber at a specified pressure so that in response to a-c excitation of said apparatus a dark space is formed in the immediate vicinity of said holder and a plasma is formed between said dark space and the inner wall of said chamber.

2. Apparatus for simultaneously etching multiple workpieces, comprising
   a cylindrical anode chamber,
   a single cathode means centrally positioned within said chamber for holding multiple workpieces,
   means for establishing a specified gaseous atmosphere within said chamber,
   means connected to said cathode means for capacitively coupling an a-c potential thereto,
   and means for connecting said anode chamber to a point of reference potential,
   whereby, in response to a-c excitation of said apparatus, a dark space envelops said cathode means and a plasma is established between said dark space and the inner wall of said chamber.

3. An apparatus as in claim 2 further including means mounted on the inner wall of said chamber for capturing material etched from said cathode means.

4. An apparatus as in claim 2 or 3 wherein said cathode means comprises a conductive multi-faceted wafer holder centrally disposed along the longitudinal axis of said cylindrical chamber.

5. An apparatus an in claim 4 further including means positioned directly above and below said holder and electrically insulated therefrom and adapted to be connected to said point of reference potential.

6. An apparatus as in claim 5 further including multiple wafer-holding strips adapted to be respectively mounted on the facets of said holder.

7. An apparatus as in claim 6 wherein each strip comprises
   a conductive member having plural recesses therein for respectively holding wafers to be etched in electrical contact with said conductive holder,
   a nonconductive member having plural apertures therethrough in aligned registry with said recesses, the diameter of each aperture being slightly less than the diameter of the wafer contained in the associated recess,
   and means for securing said members together in alignment and to a facet of said holder.

8. An apparatus as in claim 7 further including means for cooling said cathode means to maintain at the surface thereof a substantially uniform specified temperature.

9. An apparatus as in claim 8 wherein the gaseous atmosphere established within said chamber is adapted for sputter etching of said workpieces.

10. An apparatus as in claim 8 wherein the gaseous atmosphere established within said chamber is adapted for reactive sputter etching of said workpieces.

11. A dry etching process for delineating fine-line patterns in multiple workpieces simultaneously by sputter etching or reactive sputter etching in a conductive cylindrical anode chamber adapted to be connected to a point of reference potential, said process comprising the steps of
    mounting the workpieces on a single longitudinally extending cathode holder centrally positioned within said chamber,
    establishing a predetermined gaseous atmosphere at a specified pressure within said chamber in the space between the holder and the inner wall of said chamber,
    and capacitively coupling a-c power to said cathode holder to form a dark space in the immediate vicinity of said holder and to form a plasma between said dark space and the inner wall of said chamber to cause etching of said workpieces to occur.

12. In combination in a dry etching apparatus for delineating fine-line patterns in workpieces,
a conductive cylindrical anode chamber,
a single symmetrical multi-faceted conductive cathode member centrally positioned within said chamber for holding workpieces to be etched,
means for establishing a predetermined gaseous atmosphere within said chamber,
means including a nonconductive member for securing said workpieces in place on said conductive cathode member in electrical contact with said conductive member in a manner that exposes the workpiece surfaces to be etched to said gaseous atmosphere but that does not expose the surface of said conductive member thereto,
and means for capacitively coupling a-c power to said conductive cathode member and for connecting said chamber to a point of reference potential to form a dark space in the immediate vicinity of the workpiece surfaces to be etched and to form a plasma between said dark space and the inner walls of said chamber to cause etching of said workpieces to occur.

13. Apparatus for simultaneously etching multiple workpieces, comprising
a cylindrical anode chamber,
a single multi-faceted cathode element centrally positioned within said chamber for holding multiple workpieces,
means for establishing a specified gaseous atmosphere within said chamber,
means connected to said cathode element for capacitively coupling an a-c potential thereto, means for connecting said anode chamber to a point of reference potential,
and a grid element interposed between said cathode element and the inner wall of said anode chamber,
whereby, in response to a-c excitation of said apparatus, a dark space envelops said cathode element and a plasma is established between said dark space and said grid element and between said grid element and the inner wall of said chamber.

14. Apparatus as in claim 13 further including
means for mounting said grid element in an electrically isolated way with respect to said anode chamber and said cathode element.

15. Apparatus as in claim 13 further including
an external source of potential,
and means for electrically connecting said grid element through the wall of said anode chamber to said external source.

* * * * *